US009213316B2

(12) United States Patent
Suma Vinay et al.

(10) Patent No.: US 9,213,316 B2
(45) Date of Patent: Dec. 15, 2015

(54) CIRCUIT FOR DETECTING AND CORRECTING TIMING ERRORS

(71) Applicant: TEXAS INSTRUMENTS INCORPORATED, Dallas, TX (US)

(72) Inventors: Vikas Suma Vinay, Dallas, TX (US); Rajani Manchukonda, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/616,170

(22) Filed: Feb. 6, 2015

(65) Prior Publication Data

US 2015/0220065 A1 Aug. 6, 2015

Related U.S. Application Data

(60) Provisional application No. 61/936,580, filed on Feb. 6, 2014.

(51) Int. Cl.

| | |
|---|---|
| ***H03M 1/50*** | (2006.01) |
| ***G04F 10/00*** | (2006.01) |
| ***G04F 10/10*** | (2006.01) |
| ***G04F 10/04*** | (2006.01) |

(52) U.S. Cl.

CPC .............. *G04F 10/005* (2013.01); *G04F 10/04* (2013.01); *G04F 10/105* (2013.01)

(58) Field of Classification Search

CPC ...... G04F 10/005; G04F 10/105; G04F 10/04

USPC .................................................. 341/166, 155

See application file for complete search history.

(56) References Cited

U.S. PATENT DOCUMENTS

| | | | | |
|---|---|---|---|---|
| 7,236,039 | B2 * | 6/2007 | Ogasawara | 327/291 |
| 8,618,967 | B2 * | 12/2013 | Nikaeen et al. | 341/143 |
| 8,970,421 | B1 * | 3/2015 | Gao et al. | 341/166 |
| 8,976,053 | B1 * | 3/2015 | Zhang et al. | 341/155 |

* cited by examiner

*Primary Examiner* — Brian Young

(74) *Attorney, Agent, or Firm* — Lawrence J. Bassuk; Frank D. Cimino

(57) ABSTRACT

A circuit for detecting and correcting timing errors. A timing circuit includes an interpolator. The interpolator includes a fine counter, a coarse counter, and stop correction logic. The coarse counter is incremented by a rollover output of the fine counter to generate a coarse count value. The stop correction logic is coupled to the fine counter and the coarse counter. The stop correction logic divides each cycle of the rollover output into first, second, and third time intervals, and selects a coarse counter output value to represent a time interval measured by the coarse counter based on a one of the first, second, and third intervals in which a time measurement stop signal is detected.

18 Claims, 7 Drawing Sheets

CIRCUIT FOR DETECTING AND CORRECTING TIMING ERRORS

CROSS-REFERENCE TO RELATED APPLICATIONS

The present application claims priority to U.S. Provisional Patent Application No. 61/936,580, filed Feb. 6, 2014, titled "CORRECTIVE SCHEME FOR LOW POWER, HIGH RESOLUTION TRANSIT TIME MEASUREMENT," which is hereby incorporated herein by reference in its entirety.

BACKGROUND

A time to digital converter (TDC) is a device that converts time information into a digital code. The TDC measures a time difference between features of input signals and generates a digital code corresponding to the time difference. The features may, for example, include rising edges of the signals, falling edges of the signals, logic level transitions of the signals, etc. TDCs are used in a variety of applications, such as analog to digital converters, phase locked loops, delay locked loops, image sensors, scanning devices, distance measurement devices, etc.

SUMMARY

A time to digital converter that compensates for timing errors induced by use of asynchronous start and stop signals with synchronous circuitry is disclosed herein. In one embodiment, a timing circuit includes an interpolator. The interpolator includes a fine counter, a coarse counter, and stop correction logic. The coarse counter is incremented by a rollover output of the fine counter to generate a coarse count value. The rollover output includes a leading edge and a trailing edge. The stop correction logic is coupled to the fine counter and the coarse counter. The stop correction logic is configured to divide each cycle of the rollover output into three time intervals. A first of the three time intervals extends from the leading edge to a predetermined time prior to the trailing edge. A second of the three time intervals extends from the predetermined time prior to the trailing edge to a predetermined time after the trailing edge. A third of the three time intervals extends from the predetermined time after the trailing edge to a succeeding leading edge. The stop correction logic is also configured to select a coarse counter output value to represent a time interval measured by the coarse counter based on a one of the first, second, and third intervals in which a time measurement stop signal is detected.

In another embodiment, a timing circuit includes a clock counter, an interpolator, and timer control logic. The clock counter is configured to count cycles of a reference clock. The interpolator is configured to measure time intervals at higher resolution than the clock counter. The timer control logic is configured to generate a timing window about each edge of the reference clock on which the clock counter is incremented, to control starting of the clock counter based on a timing relationship of the timing window to a start signal that indicates initiation of a time interval to be measured, and to combine an output count of the clock counter and an output count of the interpolator to generate a value corresponding to a duration of the time interval to be measured.

In a further embodiment, a timing circuit includes a clock counter, an interpolator, and timer control logic. The clock counter is configured to count cycles of a reference clock. The interpolator is configured to measure time intervals at higher resolution than the clock counter. The interpolator includes a fine counter, a coarse counter, and stop correction logic. The coarse counter is incremented by a rollover output of the fine counter to generate a coarse count value. The rollover output includes a leading edge and a trailing edge. The stop correction logic is coupled to the fine counter and the coarse counter. The stop correction logic is configured to divide each cycle of the rollover output into three time intervals. A first of the three time intervals extends from the leading edge to a predetermined time prior to the trailing edge. A second of the three time intervals extends from the predetermined time prior to the trailing edge to a predetermined time after the trailing edge. A third of the three time intervals extends from the predetermined time after the trailing edge to a succeeding leading edge. The stop correction logic is also configured to select a coarse counter output value to represent a time interval measured by the coarse counter based on a one of the first, second, and third intervals in which a time measurement stop signal is detected. The timer control logic is configured to generate a timing window about each edge of the reference clock on which the clock counter is incremented, to control starting of the clock counter based on a timing relationship of the timing window to a start signal that indicates initiation of a time interval to be measured, and to combine an output count of the clock counter and an output count of the interpolator to generate a value corresponding to a duration of the time interval to be measured.

BRIEF DESCRIPTION OF THE DRAWINGS

For a detailed description of exemplary embodiments of the invention, reference will now be made to the accompanying drawings in which.

DETAILED DESCRIPTION

Figure 1:
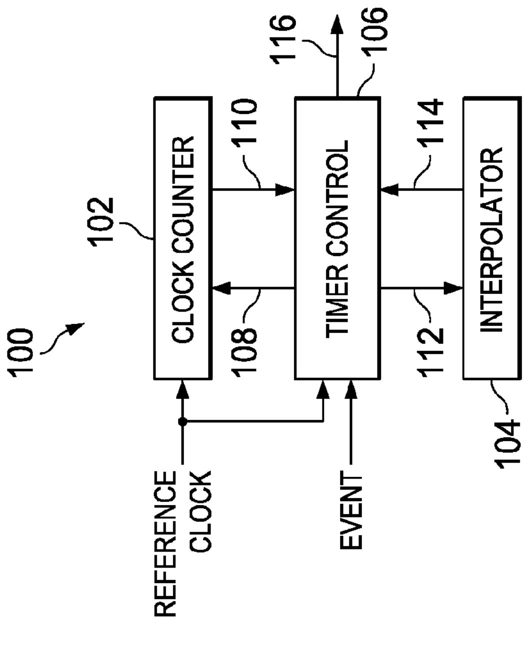
FIG. 1 shows a block diagram for a time to digital converter (TDC) in accordance with principles disclosed herein.

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . "Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be based on Y and any number of additional factors.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

High precision time to digital converters (TDCs) are subject to a variety of issues and limitations. For example, in high precision time to digital converters (TDC), resolution is limited by the fastest reference frequency available in the system, and the fastest gate-delay achievable in the applied semiconductor process. For the sub 100 pico-second resolution required in state of the art TDCs, power efficiency concerns bar the use of high frequency oscillators. Instead, interpolation techniques using delay lines are often implemented.

The use of interpolation techniques leads to two fundamental problems in cases where the START and STOP events triggering the TDC are asynchronous events that need to be detected with minimal delay. First, synchronizers and other standard digital techniques cannot be used because their use results in undesirable timing errors. Second, any counters used should be started, stopped, and count values saved without introducing timing errors.

Embodiments of the TDC disclosed herein provide high-resolution time measurements with asynchronous start and stop signals. Embodiments control counter operation based on a timing relationship of the start and stop signals defining an interval to be measured to a clock that increments the counter. Embodiments also include an interpolator that corrects coarse counter output values based on a timing relationship of the stop signal to a clock incrementing the coarse counter. The aforementioned innovations allow embodiments of the present disclosure to provide high-resolution time measurement while avoid the timing errors and other issued to which conventional TDCs are subject.

FIG. 1 shows a block diagram for a TDC 100 in accordance with principles disclosed herein. The TDC 100 is a timing circuit, and includes a clock counter 102, an interpolator 104, and timer control logic 106. The clock counter 102 is incremented by a reference clock. The clock counter 102 may be a binary counter, for example, and include any number of counter stages suitable for timing events to which the TDC 100 is applied. The frequency of the reference clock may be selected to provide timing of a predetermined time interval. For example, the reference clock may be in the 1-16 megahertz (MHz) range, or any other range deemed suitable. Generally, the frequency of the reference clock will be relatively low when compared to the resolution of timing provided by the interpolator 104.

While clock counter 102 provides time measurement that is limited to the resolution of the reference clock, the interpolator 104 can provide a substantially higher timing resolution than that associated with the reference clock. Accordingly, the interpolator 104 may time sub-intervals of the reference clock in situations where an interval to be measured by the TDC 100 is asynchronous to the reference clock.

The timer control logic 106 includes logic that controls the operation of the clock counter 102 and interpolator 104, and generates a time value based on outputs of the clock counter and/or the interpolator 104. For example, when an event (e.g., a time measurement start event) triggers the TDC 100 to begin measurement, the timer control logic 106 may assert signals 108, 112 to initiate operation of the clock counter 102 and/or the interpolator 104 as needed to measure a time interval. The timer control logic 106 may receive time measurement values 110, 114 from the clock counter 102 and/or the interpolator and process the time values (e.g., combine the time values) to generate a final time value corresponding to the measured time of the interval.

Figure 2:
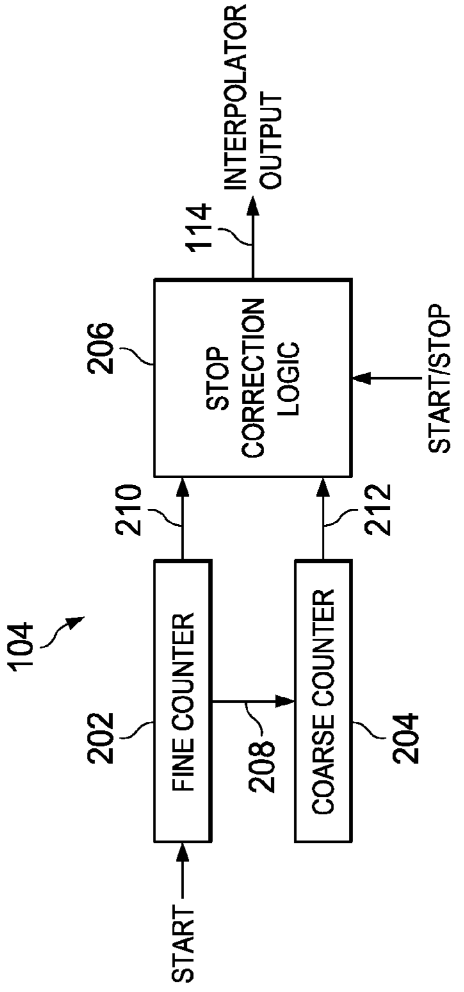
FIGS. 2 and 3 show block diagrams for an interpolator of a TDC in accordance with principles disclosed herein.

FIG. 2 shows a high level block diagram for the interpolator 104. The interpolator 104 includes a fine counter 202, a coarse counter 204, and stop correction logic 206. The fine counter 202 measures a time interval at a highest resolution provided by the interpolator 104. The coarse counter 204 is incremented by a coarse clock signal 208 generated by the fine counter 202. The coarse clock signal 208 may be a signal that defines a rollover state (i.e., transition from state N to state 0) of the fine counter 202. Thus, the coarse counter 204 may be viewed as an extension of the fine counter 202 operating at a lower frequency. The stop correction logic 206 corrects errors in the coarse counter timing output caused by the assertion of a stop signal that is asynchronous to the coarse clock signal 208. When a stop signal is asserted, the stop correction logic 206 selects a coarse counter timing output value based on the relationship of the stop signal to the coarse clock signal 208, and combines the selected coarse counter timing output value and a fine counter timing output value to produce an interpolator output value 114.

Figure 3:
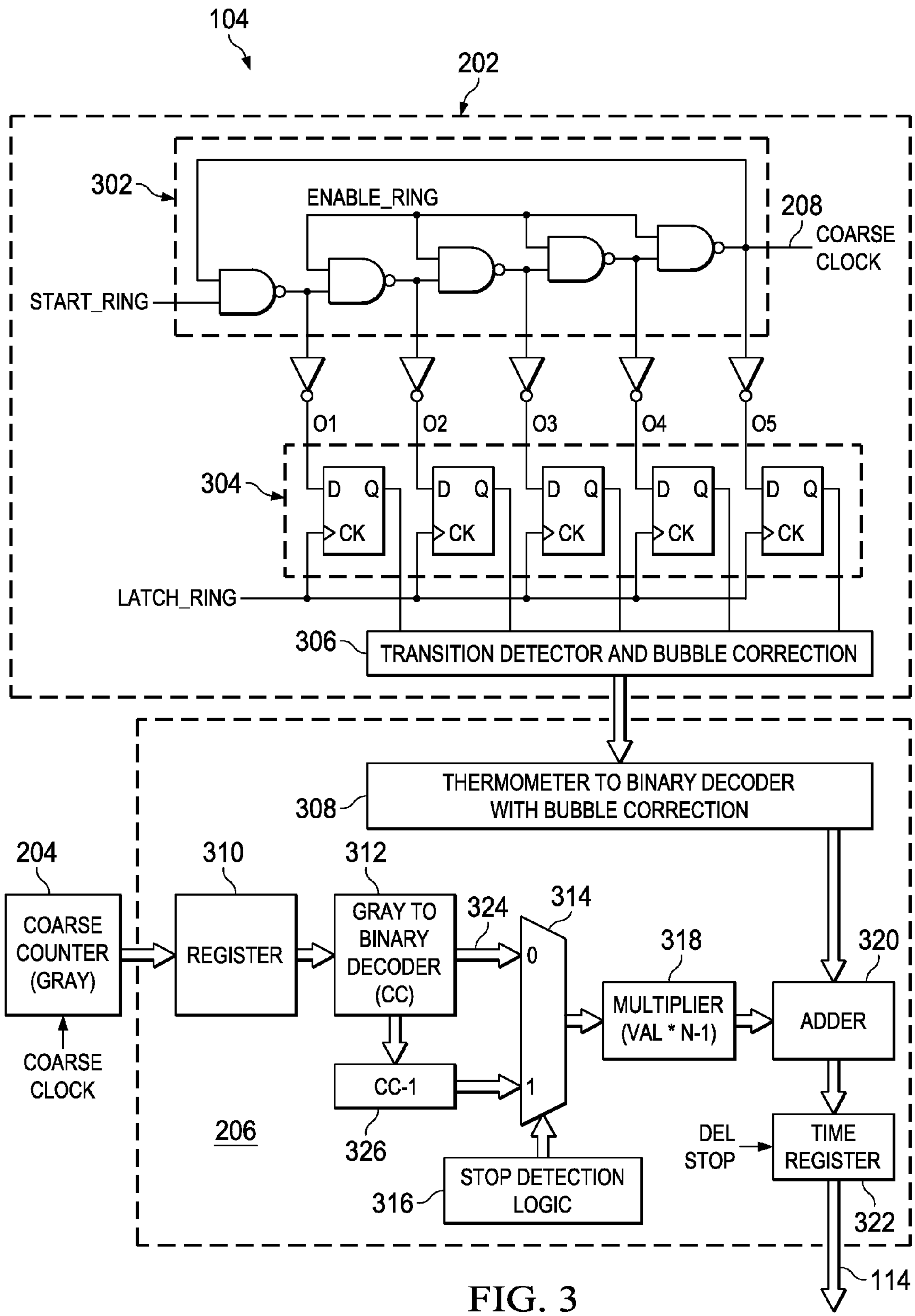

FIG. 3 shows a more detailed block diagram of the interpolator 104. The fine counter 202 includes ring oscillator 302, register 304, and transition detector 306. The ring oscillator 302 includes a plurality of serially coupled NAND gates operating as delay elements. In some embodiments a logic element other than a NAND gate may be utilized as a delay element. The ring oscillator 302 may include any number of delay elements and any number of output taps. For example, the ring oscillator 302 may include 23 delay elements and output taps as reflected in the timing of FIG. 4. When the ring oscillator 302 is activated, via signals start_ring and enable_ring, provided e.g., by the timer control logic 106, a value circulates through the oscillator stages at a frequency defined by the propagation delays of the delay elements. A coarse clock output signal (fine counter rollover signal) 208 is provided from the final stage of the ring oscillator 302 to increment the coarse counter 204.

The registers 304 latch the outputs of the ring oscillator delay elements. Table 1 shows a sequence of values output by the ring oscillator 302 and presented to the registers 304. In practice, the registers 304 may latch the ring oscillator outputs only when a timing value is needed, for example, when use of the interpolator 104 for timing measurement is complete. While particular thermometer codes are shown in Table 1 as being generated by the ring oscillator 302, some embodiments of the ring oscillator 302 may generate different thermometer codes.

TABLE 1

| Fine Counter Output Values | | | | | | |
|---|---|---|---|---|---|---|
| O1 | O2 | O3 | O4 | O5 | Fine | Coarse |
| 1 | 0 | 1 | 0 | 1 | 0 | 0 |
| 0 | 0 | 1 | 0 | 1 | 1 | 0 |
| 0 | 1 | 1 | 0 | 1 | 2 | 0 |
| 0 | 1 | 0 | 0 | 1 | 3 | 0 |
| 0 | 1 | 0 | 1 | 1 | 4 | 0 |
| 0 | 1 | 0 | 1 | 0 | 5 | 0 |
| 1 | 1 | 0 | 1 | 0 | 6 | 0 |

TABLE 1-continued

| Fine Counter Output Values | | | | | | |
|---|---|---|---|---|---|---|
| O1 | O2 | O3 | O4 | O5 | Fine | Coarse |
| 1 | 0 | 0 | 1 | 0 | 7 | 0 |
| 1 | 0 | 1 | 1 | 0 | 8 | 0 |
| 1 | 0 | 1 | 0 | 0 | 9 | 0 |
| 1 | 0 | 1 | 0 | 1 | 0 | 1 |

The transition detector 306 receives the ring oscillator count values latched in the registers 304 and adjusts the count values to correct bubbles in the latched values. Bubbles are erroneous digits (e.g., erroneous logic zeroes) in the thermometer codes generated by the fine counter 202.

The coarse counter 204 is incremented by the roll over signal 208 generated by the ring oscillator 302. The coarse counter 204 may generate count values as a gray code.

The stop correction logic 206 includes registers 310 and 322, gray code to binary code conversion logic 312, selector 314, stop detection logic 316, multiplier 318, adder 320, and thermometer to binary code conversion logic 308. The thermometer to binary code conversion logic 308 converts the thermometer code values generated by the fine counter 202 to binary count values, as illustrated in Table 1 above. In some embodiments, the thermometer to binary code conversion logic 308 may include logic to correct bubbles in the thermometer codes.

Time count values generated by the coarse counter 204 are latched in the register 310 and converted from the gray code values produced by the coarse counter 204 to binary values, by the gray code to binary code conversion logic 312. In some embodiments, the coarse counter 204 may be incremented on the leaded edge of the rollover signal 208 and the coarse counter output value latched into register 310 on the trailing edge of the rollover signal 208.

A stop signal (i.e., to halt interpolator 104 time measurement) asynchronously asserted near in time to the rollover of the fine counter can cause an error in the latched output of the coarse counter 204, which in turn can cause a substantial error in time measurement. To prevent such errors from affecting the interpolator output count value 114, the stop detection logic 316 monitors the timing of stop signal assertion relative to the rollover signal 208 that increments the coarse counter 204. Based on a relationship of the stop signal to the rollover signal, the stop detection logic 316 will correct the coarse output count value by selecting either the coarse counter output value most recently latched in register 310 or the coarse counter output value generated by the coarse counter on the cycle immediately prior to the last latched coarse counter output value to use in generation of the interpolator output value 114.

Figure 4:
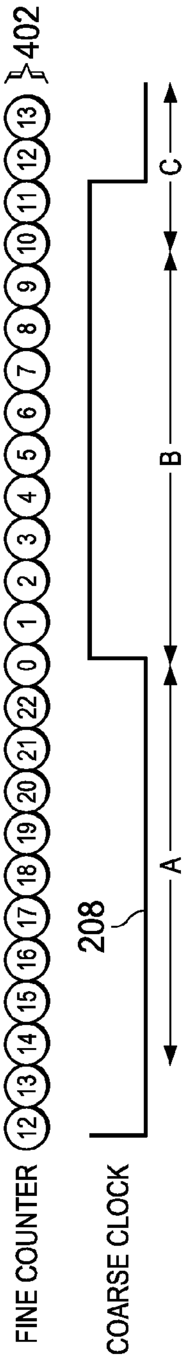
FIG. 4 illustrates interpolator division of a coarse counter clock into three timing intervals for coarse counter output correction in accordance with principles disclosed herein.

FIG. 4 illustrates interpolator division of the rollover signal 208 into three timing intervals for coarse counter output correction in accordance with principles disclosed herein. The fine counter output values 402 (count outputs of fine counter 202) corresponding to the rollover signal 208 are also shown. In this example, the fine counter 202 includes 23 delay stages. It is understood that the fine counter 202 may include any number of delay stages. The stop detection logic 316 divides each cycle of the rollover signal 208 into three intervals. Interval B starts at a first edge (termed a "leading edge") and ends a predetermined time prior to an immediately subsequent edge (termed a "trailing edge"). Interval C starts at the end of interval B (i.e., the predetermined time prior to the trailing edge), and ends a predetermined time after the trailing edge. Thus, interval C forms a timing window about the trailing edge of the rollover signal 208. Interval A starts with the end of interval C and ends with the start of interval B at the immediately subsequent leading edge of the rollover signal 208. Detection of interval A and B may be based on the count outputs of the fine counter 202. For example, interval A may be based on output values 13-22 of the fine counter 202, and interval B may be based on output values 0-8of the fine counter 202. In some embodiments of the stop detection logic 316, interval C may defined and generated based on predetermined timing values about the trailing edge (e.g., delays applied to the edge to produce a window (interval C) about the edge).

If the stop detection logic 316 detects assertion of a stop signal during intervals A or C, then the stop detection logic 316 causes the selector 314 to select the coarse counter output value generated one clock cycle prior to the last latched coarse counter output value for further processing. On the other hand, if the stop detection logic 316 detects assertion of a stop signal during interval B, then the stop detection logic 316 causes the selector 314 to select the most recently latched coarse counter output value for further processing. Stop signals asserted during interval B are asserted after the coarse counter 204 has been incremented (i.e., after the leading edge), and therefore, the last coarse count value prior to assertion of the stop signal will be latched on the subsequent trailing edge of the coarse counter clock 208. Conversely, the coarse counter 204 is incremented one additional time after assertion of a stop signal during intervals A or C, and thereafter the incremented output of the coarse counter 204 is latched. The stop detection logic 316 compensates for the additional increment of the coarse counter 204 caused by assertion of stop signals during intervals A or C. By identifying the timing relationship of the asynchronously asserted stop signal to the coarse counter clock 208, the stop detection logic 316 can correct errors in coarse counter output and resulting interpolator timing output.

Figure 5:
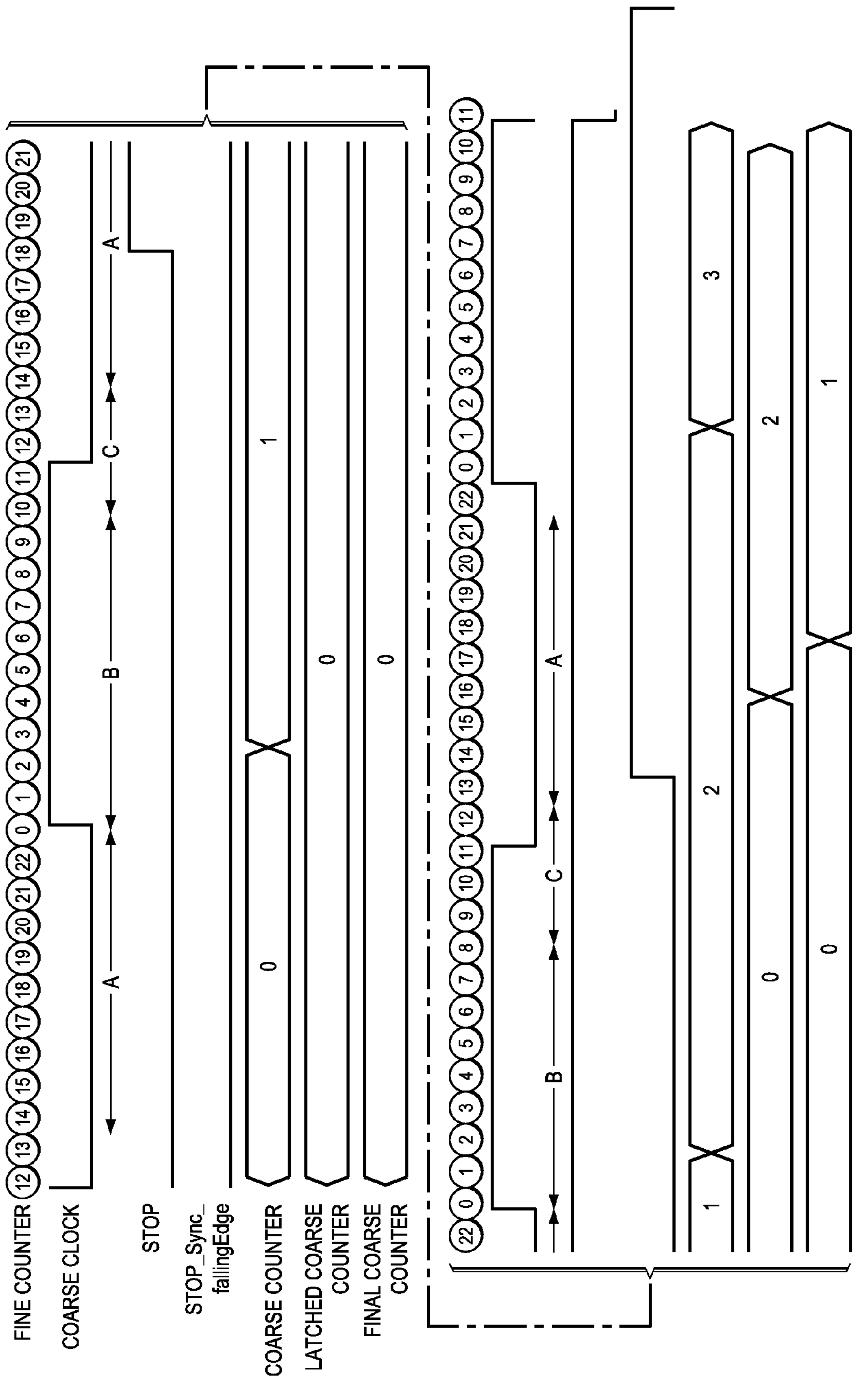
FIGS. 5-7 show coarse counter output correction based on a timing relationship of a stop signal to three coarse counter clock timing intervals in accordance with principles disclosed herein.
Figure 6:
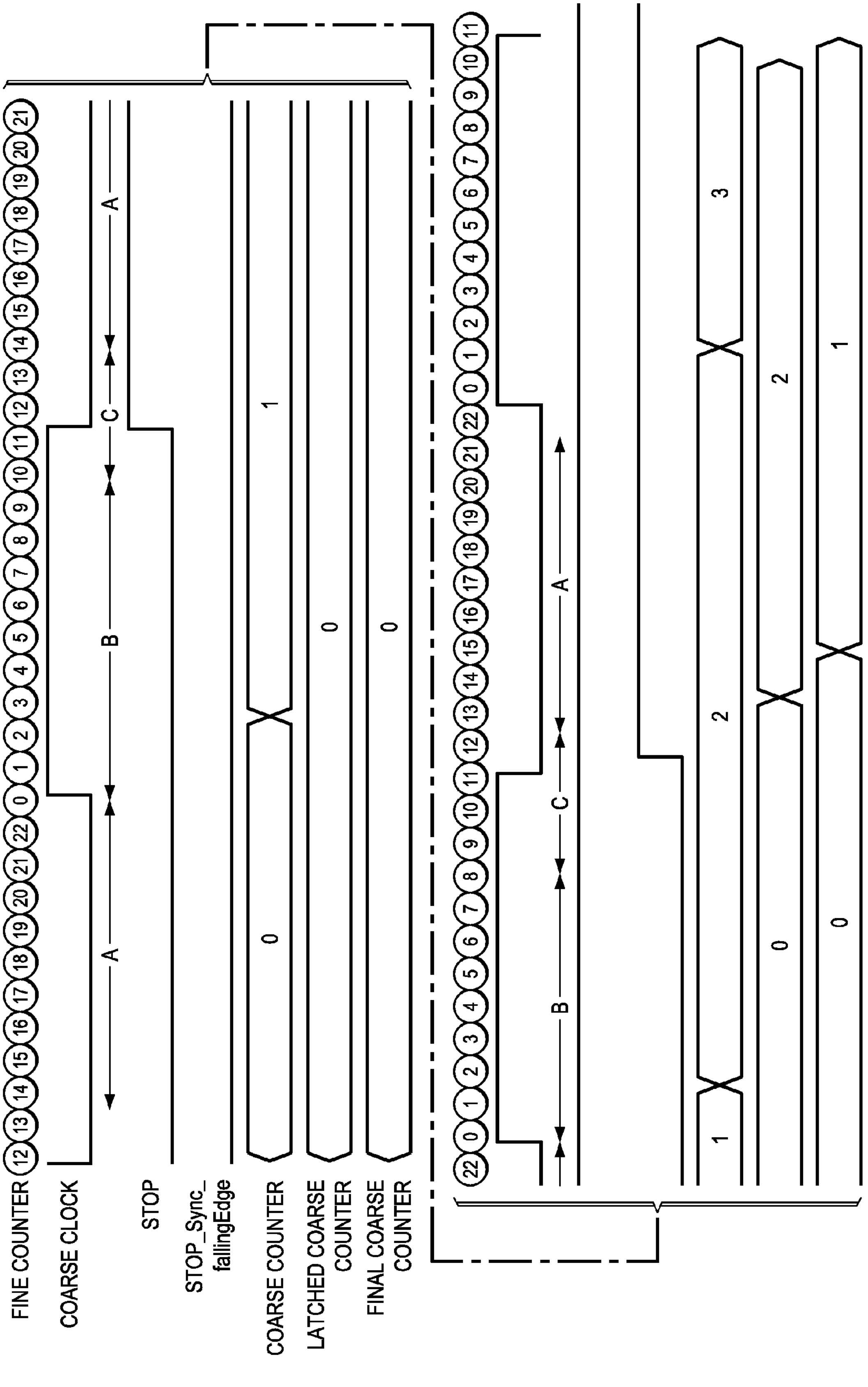
Figure 7:
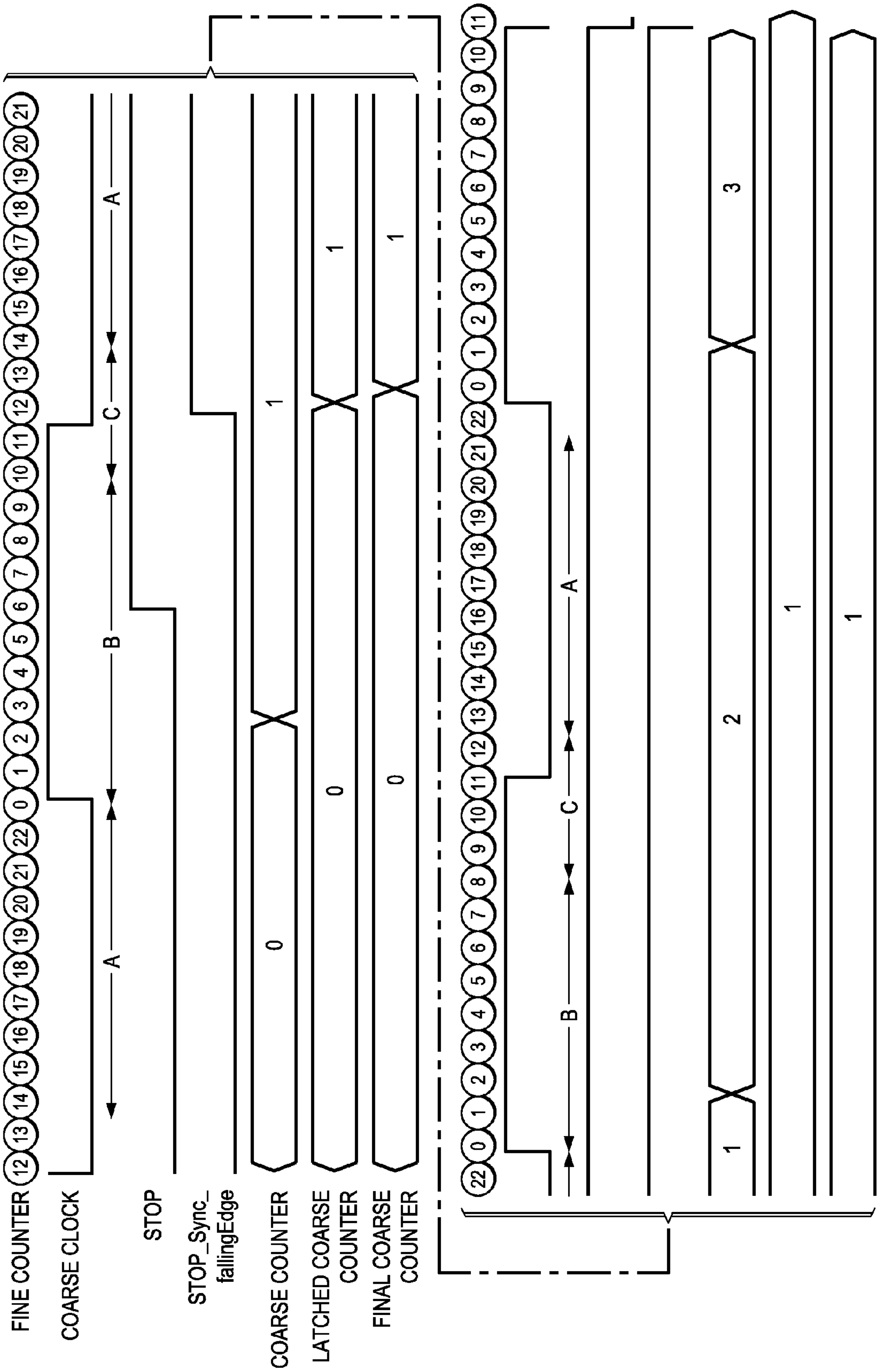

FIGS. 5-7 show coarse counter output correction based on a timing relationship of a stop signal to the three coarse counter clock timing intervals (A, B, and C) in accordance with principles disclosed herein. FIG. 5 shows a stop signal asserted in interval A, and corresponding selection of the coarse counter output value (1) generated one clock cycle prior to the last latched coarse counter output value (2). FIG. 6 shows a stop signal asserted in interval C, and corresponding selection of coarse counter output value (1) generated one clock cycle prior to the last latched coarse counter output value (2). FIG. 7 shows a stop signal asserted in interval B, and corresponding selection of the last latched coarse counter output value (1) for use in interpolator output value generation.

Returning now to FIG. 3, multiplier 318 scales the coarse counter output value, selected based on relative timing of the stops signal to the coarse clock 208, to the resolution of the fine counter output. The adder 320 adds the scaled coarse counter output value and the fine counter output value to generate the interpolator output value 114.

Figure 8:
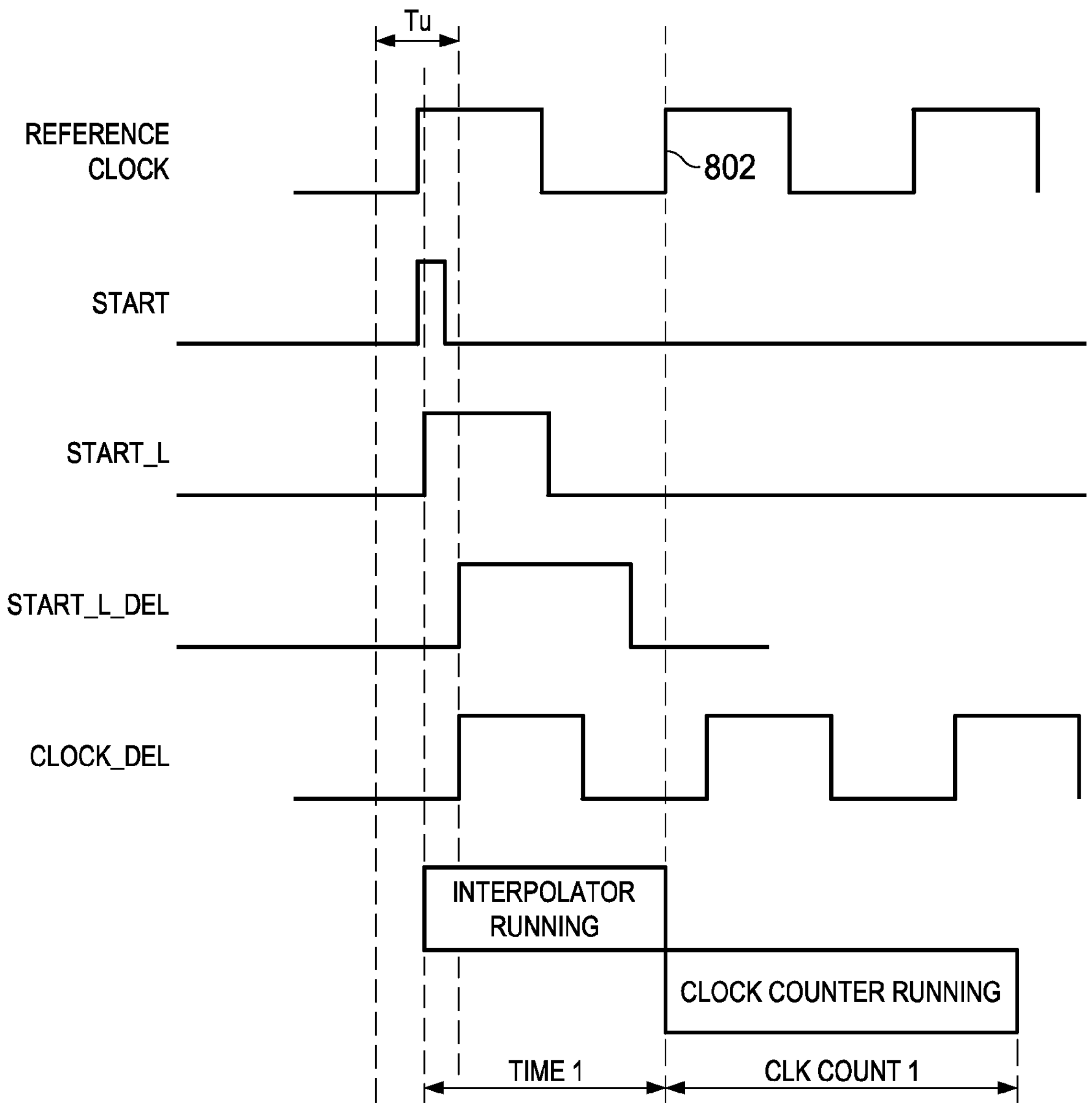
FIG. 8 illustrates generation of time window about an edge of a reference clock that advances a clock counter of a TDC for control of clock counter activation in accordance with principles disclosed herein.

To eliminate timing errors due to uncertainties arising from the asynchronous nature of the signals that start and stop the TDC 100, the timer control logic 106 controls activation of the clock counter 102 and the interpolator 104 based on the timing relationship between the start/stop signals and the edge of the reference clock on which the clock counter 102 is incremented. FIG. 8 illustrates timer control logic 106 control of the interpolator 104 and the clock counter 102 based on the timing of start signal assertion.

The timer control logic 106 generates a time window (Tu) about the edge of the reference clock that increments the clock counter 102. In FIG. 8, the rising edge of the reference clock increments the clock counter 102. In other embodiments, the falling edge of the reference clock may increment the clock counter 102. The timer control logic 106 may generate the time window Tu based on delayed versions of the reference clock. The arrangement of the time window Tu about the edge of the reference clock may define timing about the edge during which setup and/or hold times may be inadequate to ensure proper operation of the clock counter 102.

If a start or stop signal is asserted within the timing window Tu, then the timer control logic 106 may delay activation of the clock counter 102 until the next occurring edge of the reference clock that increments the clock counter (i.e., the next rising edge of the reference clock). In FIG. 8, the start signal is asserted during the timing window Tu, as a result, the timer control logic 106 delays activation of the clock counter 102 until the next rising edge 802 of the reference clock and activates the interpolator 104 to time the interval between the start signal assertion and subsequent activation of the clock counter 102. For example, to avoid errors while determining whether the start signal is asserted within the timing window Tu, the interpolator 104 may always be activated when the start signal is asserted.

If a stop signal is asserted during the timing window Tu, then the timer control logic 106 allows the clock counter 102 to remain active until the next rising edge of the reference clock and activates the interpolator 104 to time the interval between the stop signal and the deactivation of the clock counter 102.

Figure 9:
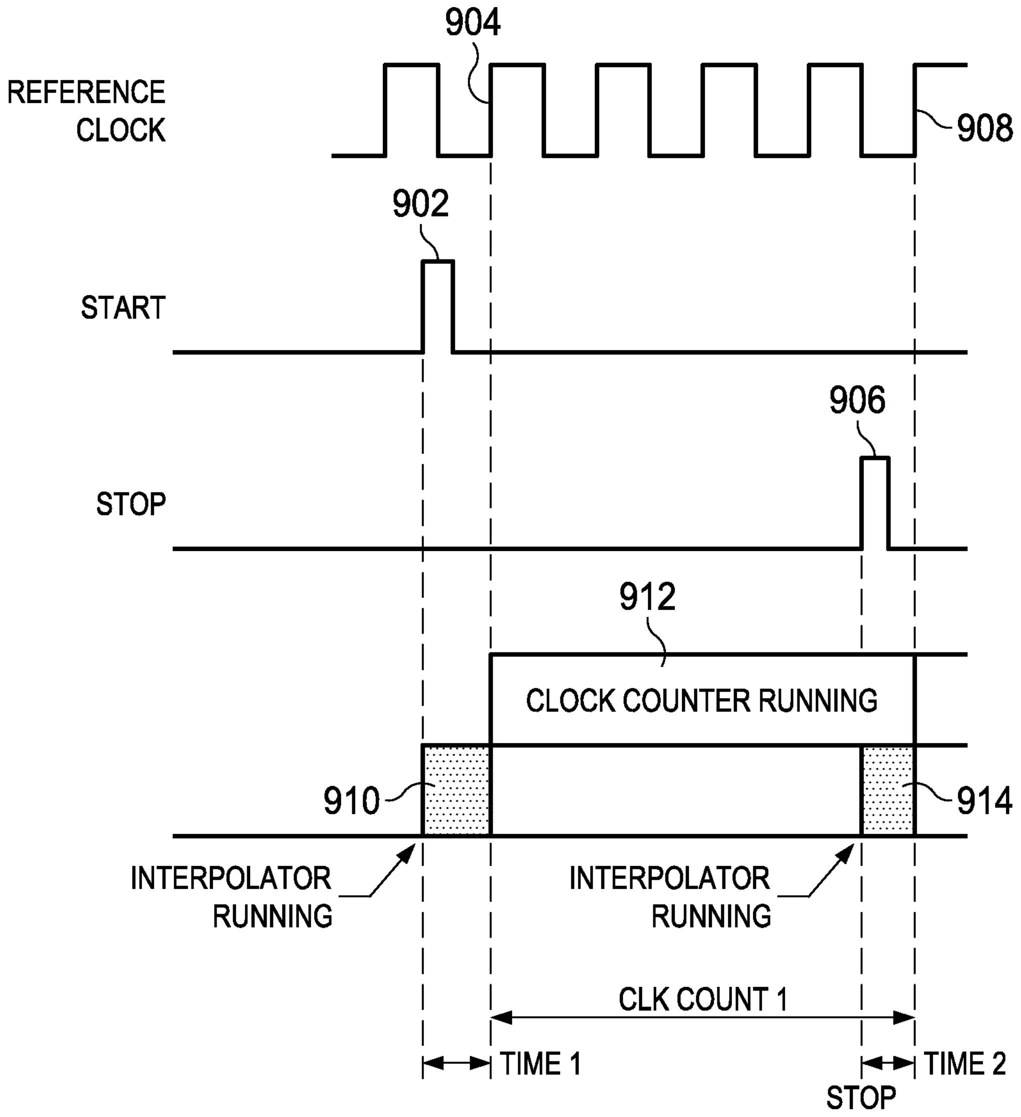
FIG. 9 shows operation of a TDC in accordance with principles disclosed herein.

FIG. 9 shows an example of operation of the TDC 100. Start signal 902 is asserted asynchronously with respect to the reference clock to initiate timing of an interval. Responsive to the start signal 902, timer control logic 106 activates the interpolator 104 and schedules the clock counter 102 to start at the next rising edge 904 of the reference clock. At edge 904, the clock counter 102 is activated and the interpolator 104, having timed the interval between the start signal 902 and edge 904, is deactivated. Sometime later, stop signal 906 is asserted and, in response, the timing control logic 106 schedules the clock counter 102 to stop at the next rising edge 908 of the reference clock and activates the interpolator 104 to time the interval between the stop signal 906 and the edge 908. The timer control logic 106 retrieves from the interpolator 104 and the clock counter 102 the measurements corresponding to intervals 910, 912, and 914 and combines the measurements to produce a measurement of the interval between start signal 902 and stop signal 906. For example, measurement of interval 914 from the interpolator 104 is subtracted from the sum of measurement of interval 912 from the clock counter and measurement of interval 910 from the interpolator to produce a measurement of the interval between start signal 902 and stop signal 906.

The timing circuits disclosed herein are suitable for use in various devices and applications that require precise time measurement. For example, the TDC 100, or portions thereof (e.g., the interpolator 104) may be included in an analog to digital converter, a phase locked loop, a delay locked loop, an image sensor, a scanning device, a distance measurement device, or any other device that benefits from precise time measurement.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A timing circuit, comprising:
an interpolator comprising:
a fine counter; and
a coarse counter incremented by a rollover output of the fine counter to generate a coarse count value, wherein the rollover output comprises a leading edge and a trailing edge;
stop correction logic coupled to the fine counter and the coarse counter, the stop correction logic configured to:
divide each cycle of the rollover output into time intervals comprising:
a first time interval extending from the leading edge to a predetermined time prior to the trailing edge;
a second time interval extending from the predetermined time prior to the trailing edge to a predetermined time after the trailing edge; and
a third time interval extending from the predetermined time after the trailing edge to a succeeding leading edge; and
select a coarse counter output value to represent a time interval measured by the coarse counter based on a one of the first, second, and third intervals in which a time measurement stop signal is detected.

2. The timing circuit of claim 1, wherein the stop correction logic is configured to:
generate the first time interval as comprising count values 0-8 produced by the fine counter; and
generate the third time interval as comprising count values 13-22 produced by the fine counter.

3. The timing circuit of claim 1, wherein the stop correction logic is configured to:
select a current count value of the coarse counter to represent the time interval measured by the coarse counter based on the time measurement stop signal being detected during the first interval; and
select one less than the current count value of the coarse counter to represent the time interval measured by the coarse counter based on the time measurement stop signal being detected during the second interval or the third interval.

4. The timing circuit of claim 1, further comprising:
a clock counter that counts cycles of a reference clock, a frequency of the reference clock lower than a frequency of the rollover output of the fine counter; and
timer control logic configured to:
generate a timing window about each edge of the reference clock on which the clock counter is incremented;
control starting of the clock counter based on a timing relationship of the timing window to a start signal that indicates initiation of a time interval to be measured.

5. The timing circuit of claim 4, wherein the timer control logic is configured to control stopping of the clock counter based on a timing relationship of the timing window to a stop signal that indicates completion of the time interval to be measured.

6. The timing circuit of claim 5, wherein the timer control logic is configured to delay the starting or stopping of the clock counter by a cycle of the reference clock based on the start signal or the stop signal occurring within the timing window.

7. The timing circuit of claim 5, wherein the timer control logic is configured to activate the interpolator to time an interval between the start signal and the starting of the clock counter, and time an interval between the stop signal and the stopping of the clock counter.

8. The timing circuit of claim 4, wherein the timer control logic is configured to combine an output count of the clock counter and an output count of the interpolator to generate a value corresponding to the time interval to be measured.

9. A timing circuit comprising:

a clock counter configured to count cycles of a reference clock;

an interpolator configured to measure time intervals at higher resolution than the clock counter; and timer control logic configured to:

generate a timing window about each edge of the reference clock on which the clock counter is incremented;

control starting of the clock counter based on a timing relationship of the timing window to a start signal that indicates initiation of a time interval to be measured; and combine an output count of the clock counter and an output count of the interpolator to generate a value corresponding to a duration of the time interval to be measured, wherein the timer control logic is configured to control stopping of the clock counter based on a timing relationship of the timing window to a stop signal that indicates completion of the time interval to be measured, wherein the timer control logic is configured to delay the starting or stopping of the clock counter by a cycle of the reference clock based on the start signal or the stop signal occurring within the timing window.

10. The timing circuit of claim 9, wherein the timer control logic is configured to activate the interpolator to time an interval between the start signal and the starting of the clock counter, and time an interval between the stop signal and the stopping of the clock counter.

11. The timing circuit of claim 9, wherein the interpolator comprises:

a fine counter;

a coarse counter incremented by a rollover output of the fine counter, wherein the coarse counter is incremented on a leading edge of the rollover output and a coarse count value generated by the coarse counter is latched on a trailing edge of the rollover output; and stop correction logic coupled to the fine counter and the coarse counter, the stop correction logic configured to:

divide each cycle of the rollover output into time intervals comprising:

a first time interval extending from the leading edge to a predetermined time prior to the trailing edge;

a second time interval extending from the predetermined time prior to the trailing edge to a predetermined time after the trailing edge; and a third time interval extending from the predetermined time after the trailing edge to a succeeding leading edge; and select a coarse counter output value to represent a time interval measured by the coarse counter based on a one of the first, second, and third intervals in which a time measurement stop signal is detected.

12. The timing circuit of claim 11, wherein the first time interval comprises count values 0-8 of the fine counter; and the third time interval comprises count values 13-22 of the fine counter.

13. The timing circuit of claim 11, wherein the stop correction logic is configured to:

select a current count value of the coarse counter to represent the time interval measured by the interpolator based on the time measurement stop signal being detected during the first time interval; and select one less than the current count value of the coarse counter to represent the time interval measured by the interpolator based on the time measurement stop signal being detected during the second time interval or the third interval.

14. The timing circuit of claim 9, wherein the interpolator comprises a ring oscillator configured to resolve time intervals measured by the interpolator with sub 100 picosecond resolution.

15. A timing circuit comprising:

a clock counter configured to count cycles of a reference clock;

an interpolator configured to measure time intervals at higher resolution than the reference clock, the interpolator comprising:

a fine counter;

a coarse counter incremented by a rollover output of the fine counter, wherein the coarse counter is incremented on a leading edge of the rollover output and an coarse count value generated by the coarse counter is latched on a trailing edge of the rollover output; and stop correction logic coupled to the fine counter and the coarse counter, the stop correction logic configured to:

divide each cycle of the rollover output into time intervals comprising:

a first time interval extending from the leading edge to a predetermined time prior to the trailing edge;

a second time interval extending from the predetermined time prior to the trailing edge to a predetermined time after the trailing edge; and a third time interval extending from the predetermined time after the trailing edge to a succeeding leading edge; and select a coarse counter output value to represent a time interval measured by the interpolator based on a one of the first, second, and third intervals in which a time measurement stop signal is detected; and timer control logic configured to:

generate a timing window about each edge of the reference clock on which the clock counter is incremented;

control starting of the clock counter based on a timing relationship of the timing window to a start signal that indicates initiation of a time interval to be measured; and combine an output count of the clock counter and an output count of the interpolator to generate a value corresponding to the time interval to be measured.

16. The timing circuit of claim 15, wherein the timer control logic is configured to control stopping of the clock counter based on a timing relationship of the timing window to a stop signal that indicates completion of the time interval to be measured.

17. The timing circuit of claim 16, wherein the timer control logic is configured to:

delay the starting or stopping of the clock counter by a cycle of the reference clock based on the start signal or the stop signal occurring within the timing window; and activate the interpolator to:

time an interval between the start signal and the starting of the clock counter, and time an interval between the stop signal and the stopping of the clock counter.

18. The timing circuit of claim 15, wherein the stop correction logic is configured to:

select a current count value of the coarse counter to represent the time interval measured by the interpolator based on the time measurement stop signal being detected during the first interval; and select one less than the current count value of the coarse counter to represent the time interval measured by the interpolator based on the time measurement stop signal being detected during the second interval or the third interval.

* * * * *